United States Patent
Sasaki

(10) Patent No.: US 7,414,349 B2
(45) Date of Patent: Aug. 19, 2008

(54) PIEZOELECTRIC VIBRATOR, FILTER USING THE SAME AND ITS ADJUSTING METHOD

(75) Inventor: Yukinori Sasaki, Nishinomiya (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 206 days.

(21) Appl. No.: 10/500,393

(22) PCT Filed: Oct. 24, 2003

(86) PCT No.: PCT/JP03/13633

§ 371 (c)(1),
(2), (4) Date: Jun. 28, 2004

(87) PCT Pub. No.: WO2004/038914

PCT Pub. Date: May 6, 2004

(65) Prior Publication Data

US 2005/0012569 A1    Jan. 20, 2005

(30) Foreign Application Priority Data

Oct. 28, 2002  (JP) .............................. 2002-312444

(51) Int. Cl.
H01L 41/08    (2006.01)
(52) U.S. Cl. ........................ 310/324; 310/346
(58) Field of Classification Search ........... 310/324, 310/346, 320, 334, 340; 333/191, 187
See application file for complete search history.

(56) References Cited

U.S. PATENT DOCUMENTS

| | | | | |
|---|---|---|---|---|
| 4,456,850 A | * | 6/1984 | Inoue et al. | ......... 310/324 |
| 4,642,508 A | * | 2/1987 | Suzuki et al. | ......... 310/321 |
| 6,556,103 B2 | * | 4/2003 | Shibata et al. | ......... 333/187 |

FOREIGN PATENT DOCUMENTS

| | | |
|---|---|---|
| JP | 58-29211 A | 2/1983 |
| JP | 58-121815 | 7/1983 |
| JP | 58-137317 A | 8/1983 |
| JP | 58-137318 A | 8/1983 |
| JP | 62081807 | * 10/1985 |

(Continued)

OTHER PUBLICATIONS

Marc-Alexander Dubois and Paul Murant, "Properties of Aluminum nitride thin films for piezoelectroc transducers and microwave filter applications", Applied Physics Letters, May 17, 1999. pp. 3032-3034.

(Continued)

Primary Examiner—Mark Budd
(74) Attorney, Agent, or Firm—RatnerPrestia

(57) ABSTRACT

A piezoelectric vibrator has a laminated structure where silicon oxide films having substantially the same thickness are disposed at both faces of piezoelectric plate as dielectric films. Using the structure discussed above, because dielectric films are formed at the both faces of the piezoelectric plate a difference of internal stress, which is caused by a difference of stress relaxation in a long term and affects the piezoelectric plate or the dielectric film, becomes small. Therefore, a warp can be considerably small. As a result, a change, which is caused by the warp of the piezoelectric vibrator, in a resonance frequency of the piezoelectric vibrator can be small.

12 Claims, 3 Drawing Sheets

FOREIGN PATENT DOCUMENTS

| | | |
|---|---|---|
| JP | 62-081807 A | 4/1987 |
| JP | 03-88407 A | 4/1991 |
| JP | 09-064683 A | 3/1997 |
| JP | 2000-040931 A | 2/2000 |
| JP | 2000-209063 A | 7/2000 |
| JP | 2001-168674 | 6/2001 |

OTHER PUBLICATIONS

European Search Report corresponding to application No. EP 03-75-8882 dated Apr. 18, 2005.

International Search Report for PCT/JP2003/13633, dated Feb. 17, 2004.

* cited by examiner

PIEZOELECTRIC VIBRATOR, FILTER USING THE SAME AND ITS ADJUSTING METHOD

This Application is a U.S. National Phase Application of PCT International Application PCT/JP2003/013633.

TECHNICAL FIELD

The present invention relates to a piezoelectric vibrator, a filter using the same and its adjusting method.

BACKGROUND ART

As a piezoelectric element using a bulk wave which travels through a solid, a piezoelectric vibrator used as a source of clock signals for various electronic instruments or a piezoelectric filter used for sampling frequencies of communication instruments is known. Recently, the piezoelectric element has been used at a high frequency. Most of the piezoelectric elements employ thickness shear vibration or thickness longitudinal vibration as principal vibration, and a resonance frequency of the principal vibration is inversely proportional to a thickness of a piezoelectric plate. Therefore, the piezoelectric element is attempted to be used at a higher frequency by forming the piezoelectric plate with a thin film or the like.

The conventional piezoelectric element is disclosed in "Properties of Aluminum nitride thin films for piezoelectric transducers and microwave filter applications", written by Marc-Alexander Dubois and Paul Murant, on pp. 3032-3034 of Applied Physics Letters in May 17, 1999.

As shown in conventional piezoelectric element 901 of FIG. 9, aluminum nitride thin film 91 is used as the piezoelectric plate, and exciting electrodes 92 are formed on its front and back. A dielectric film formed of a laminated layer of silicon nitride film 93 and silicon oxide film 94 is disposed at one surface of film 91. In addition, the whole piezoelectric vibrator is disposed on silicone substrate 95 so that very thin piezoelectric vibrator is treated easily.

In the conventional structure discussed above, an elastic constant of the piezoelectric film and the dielectric film and a size thereof are determined in a manner that a temperature coefficient of the resonance frequency of the piezoelectric vibrator becomes zero at an initial stage after deposition. However, in the conventional structure, long-term reliability for stress relaxation of each film is not considered. Therefore, according as time passes, a warp, namely a change in size, of the whole piezoelectric vibrator becomes larger than that at the initial stage because of a difference of the stress relaxation of the piezoelectric film and the dielectric film. As a result, this warp brings a change in resonance frequency.

SUMMARY OF THE INVENTION

The present invention is directed to solve the problems discussed above and therefore, it is an object of the invention to provide a piezoelectric vibrator whose change in a resonance frequency caused by a warp is small, a filter using the vibrator and an adjusting method thereof.

According to the present invention, in the piezoelectric vibrator where polarization of a piezoelectric plate points in a direction of a thickness, electrodes are formed at both faces of the piezoelectric plate. Furthermore, dielectric films are formed at the both faces of the piezoelectric plate. In addition, these dielectric films are substantially symmetric with respect to a point across the piezoelectric plate and geometrically similar, and substantially have the same thickness. The piezoelectric plate employs thickness longitudinal vibration as principal vibration.

Using the structure discussed above, because dielectric films are formed at the both faces of the piezoelectric plate, a difference of internal stress, which is caused by a difference of stress relaxation in a long term and affects the piezoelectric plate or the dielectric film, becomes small. Therefore, the warp can be considerably small. As a result, a change, which is caused by the warp of the piezoelectric vibrator, in a resonance frequency of the piezoelectric vibrator can be small.

DETAILED DESCRIPTION OF PREFERRED EMBODIMENTS

Exemplary embodiments are demonstrated hereinafter with reference to FIG. 1 through FIG. 8.

First Exemplary Embodiment

Figure 1:
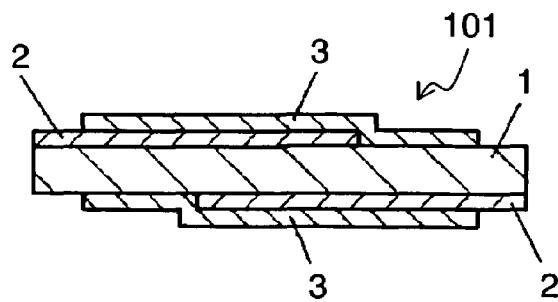
FIG. 1 is a sectional view of a piezoelectric vibrator in accordance with an exemplary embodiment of the present invention.

FIG. 1 is a sectional view showing piezoelectric vibrator 101 which uses aluminum nitride as its piezoelectric material and a fundamental mode of thickness longitudinal vibration as principal vibration. Polarization thereof points in a direction of a thickness of a piezoelectric plate. Piezoelectric vibrator 101 is formed of piezoelectric plate 1 made of aluminum nitride, exciting electrodes 2, facing each other provided at both faces of piezoelectric plate 1 and silicon oxide films 3 disposed on both faces of piezoelectric plate 1 as dielectric films.

Piezoelectric plate 1 made of aluminum nitride has a thickness of 1 μm. Silicon oxide films 3 are formed at both faces of piezoelectric plate 1 so as to have the same thickness of 0.4 μm and substantially the same area each other. Therefore, a difference of internal stress, which is caused by a difference of stress relaxation in a long term and affects piezoelectric plate 1 or the silicon oxide, becomes small. Accordingly, a warp can be considerably small. As a result, a change, which is caused by the warp of the piezoelectric vibrator, in a resonance frequency of piezoelectric vibrator 101 can be small.

The silicon oxide used as material of silicon oxide film 3 has a negative temperature coefficient of frequency. On the other hand, aluminum nitride used as material of piezoelectric plate 1 has a positive temperature coefficient of frequency. By laminating these materials, i.e., silicon oxide and aluminum nitride, the temperature coefficient of frequency can be substantially canceled, so that the temperature characteristics of frequency can be improved. The same effect can be obtained by using a laminated layer formed of a silicon oxide film and a silicon nitride film instead of the silicon oxide film as material of silicon oxide film 3.

According to the first embodiment, a fundamental mode is used as principal vibration. Therefore, variations in the resonance frequency for variations in thickness of piezoelectric plate 1 or silicon oxide film 3, i.e., dielectric film, are reduced approximately half compared with a 2nd overtone mode. As a result, the resonance frequency or an electromechanical coupling factor can be precisely adjusted to a desired value.

The resonance frequency of piezoelectric vibrator 101 is determined by a thickness of piezoelectric plate 1, a thickness of exciting electrode 2 and a thickness of silicon oxide film 3. In addition, the electromechanical coupling factor, which is one of important items of electrical characteristics, is known to be also changed by thicknesses thereof.

Figure 2:
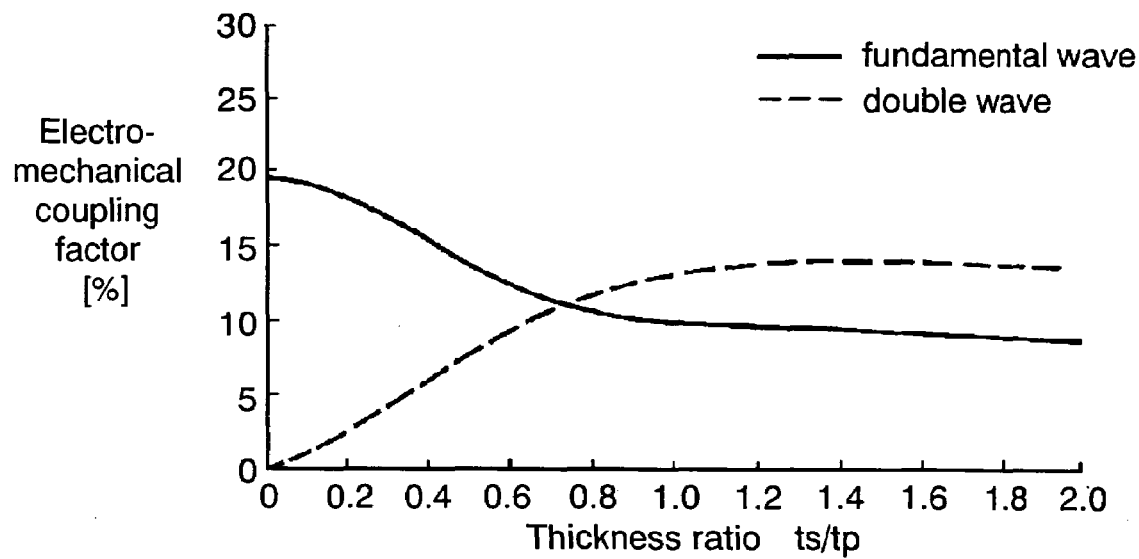
FIG. 2 shows a relation between a ratio of a thickness of a dielectric film to that of a piezoelectric plate and an electromechanical coupling factor.

FIG. 2 shows variations in the electromechanical coupling factor of piezoelectric vibrator 101 which uses aluminum nitride as its piezoelectric material and in which polarization of piezoelectric plate 1 points in a direction of a thickness of piezoelectric plate 1. Piezoelectric vibrator 101 forms silicon oxide films 3 having the same thickness on both faces of piezoelectric plate 1 as dielectric films. In particular, FIG. 2 shows variations in the electromechanical coupling factor in a case where ratio "ts/tp" indicating the ratio of sum "ts" to thickness "tp" is changed. Sum "ts" indicates the sum of a thickness of silicon oxide film 3 of one side of piezoelectric plate 1 and a thickness of another silicon oxide film 3 of the other side of piezoelectric plate 1. Thickness "tp" indicates a thickness of piezoelectric plate 1. FIG. 2 shows the electromechanical coupling factors in cases of the fundamental mode of the thickness longitudinal vibration and the 2nd overtone mode thereof.

As shown in a result of a simulation of FIG. 2, in both cases of the fundamental mode and the 2nd overtone mode, when ratio "ts/tp" ranges not less than 0.7 and not more than 2.0, variations in the electromechanical coupling factors range within 0.25% of a minimum value thereof. In other words, the coupling factors of the fundamental mode are stabilized within 9.5-11.5%, and the coupling factors of the 2nd overtone mode are also stabilized within 12.0-14.0%. Because the electromechanical coupling factors become stable, stable characteristics can be obtained in cases where a piezoelectric vibrator is used in a voltage-controlled oscillator (VOC), a piezoelectric filter is formed of a plurality of piezoelectric vibrators or the like.

When ratio "ts/tp" becomes larger than 2.0, a mass load for the thickness longitudinal vibration becomes too much and a mechanical quality factor, which is an index of easiness of vibration, becomes small, so that it is not suitable for practical use.

In an adjusting process where the resonance frequency of the piezoelectric vibrator is adjusted to the desired value, a silicon oxide film is further disposed on or removed from one of the silicon oxide films formed on aluminum nitride so that silicon oxide film 3 having a certain thickness is formed.

According to the first embodiment, sum "ts" of a thickness of silicon oxide film 3 of one side of piezoelectric plate 1 and a thickness of another silicon oxide film 3 of the other side of piezoelectric plate 1 is 0.8 μm. Thickness "tp" of piezoelectric plate 1 made of aluminum nitride is 1 μm. Therefore, ratio "ts/tp" becomes 0.8. Because ratio "ts/tp" ranges not less than 0.7 and not more than 2.0, namely, within an area where variations in the electromechanical coupling factor become small, the electromechanical coupling factor is hardly changed at the adjustment of the resonance frequency. In a word, according to the first embodiment, the adjusting process where the electromechanical coupling factor is hardly changed can be realized.

In the first embodiment, aluminum nitride is used as piezoelectric material, however, the same effect can be obtained by using other piezoelectric material such as PZT or ZnO.

Furthermore, in this embodiment, the method of adjusting resonance frequencies is described by further disposing or removing a silicon oxide film on one of the silicon oxide films formed on piezoelectric vibrator 101. However, in order to adjusting resonance frequencies, a silicon oxide film may be disposed on or removed from the other of the silicon oxide films. In addition, silicon oxide films may be disposed on or removed from both of the silicon oxide films.

Second Exemplary Embodiment

Figure 3:
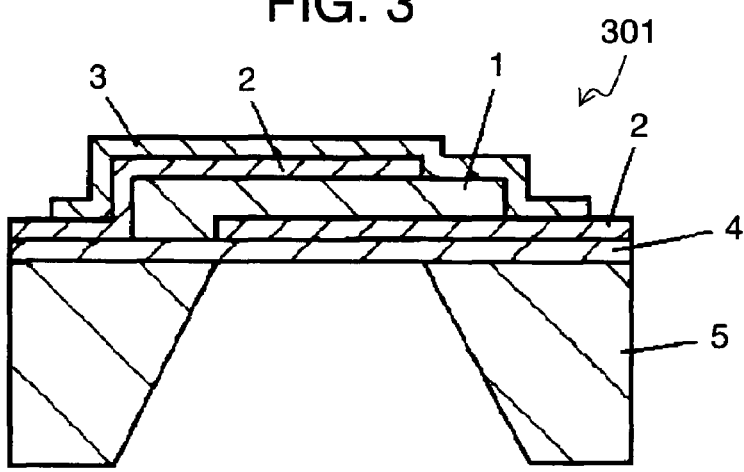
FIG. 3 is a sectional view of a piezoelectric vibrator in accordance with another exemplary embodiment of the present invention.

FIG. 3 is a sectional view showing piezoelectric vibrator 301 which uses aluminum nitride as its piezoelectric material and a 2nd overtone mode of thickness longitudinal vibration as principal vibration. Polarization thereof points in a direction of a thickness of a piezoelectric plate. Piezoelectric vibrator 301 is formed of piezoelectric plate 1 made of aluminum nitride, exciting electrodes 2, facing each other, provided at both faces of piezoelectric plate 1, silicon oxide film 3, which is used as a first dielectric film, disposed on a back face of piezoelectric plate 1 and silicon nitride film 4, which is used as a second dielectric film, disposed on a front face of piezoelectric plate 1. Supporting substrate 5 supports piezoelectric vibrator 301.

Piezoelectric plate 1 made of aluminum nitride has a thickness of 10 μm. Silicon oxide film 3 has a thickness of 4 μm, and silicon nitride film 4 has a thickness of 5 μm, so that dielectric films having substantially the same thickness each other are formed at both sides of piezoelectric plate 1.

In addition, an area of silicon nitride film 4 is formed so as to be substantially the same as an area of silicon oxide film 3. In other words, the area of silicon nitride film 4 becomes 0.8-1.2 times as large as that of silicon oxide film 3. Therefore, a difference of internal stress, which is caused by a difference of stress relaxation in a long term and affects piezoelectric plate 1 or the dielectric film, becomes small. Accordingly, a warp can be considerably small. As a result, a change, which is caused by the warp of piezoelectric vibrator 301, in a resonance frequency of the piezoelectric vibrator can be small.

In the second embodiment, the piezoelectric vibrator may be produced according to the following processes.

Disposing silicon nitride film 4 on supporting substrate 5 made of silicon by injecting nitrogen, Forming piezoelectric vibrator 301, which uses aluminum nitride as its piezoelectric material, thereon, and Removing supporting substrate 5 from its back by chemical etching or the like to make a vibration section of piezoelectric vibrator 301 a hollow structure.

Using the processes discussed above, piezoelectric vibrator 301 can be produced easily because silicon nitride film 4 can work for stopping the etching of supporting substrate 5.

In addition, according to the present embodiment, approximately two times higher resonance frequency can be obtained compared with a fundamental mode by using a 2nd overtone mode as principal vibration.

As discussed above, in a case where a high resonance frequency is required, a 2nd overtone mode is selected. In a case where easy adjustment of a resonance frequency takes priority, a fundamental mode is selected.

Third Exemplary Embodiment

Figure 4:
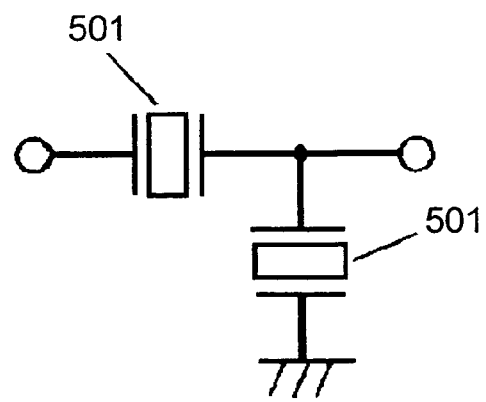
FIG. 4 shows an electrical equivalent circuit of a ladder type filter using the piezoelectric vibrator.

A band-pass filter, which can pass signals in specific frequencies, is known to be produced by combining a plurality of piezoelectric vibrators. In general, a ladder type filter, which uses a resonance frequency or an anti-resonance frequency of a vibrator as a pole of a filter characteristic and uses an interval between the resonance frequency and the anti-resonance frequency as a pass band, is provided. FIG. 4 shows an electrical equivalent circuit of the ladder type filter using two piezoelectric vibrators 501.

Figure 5:
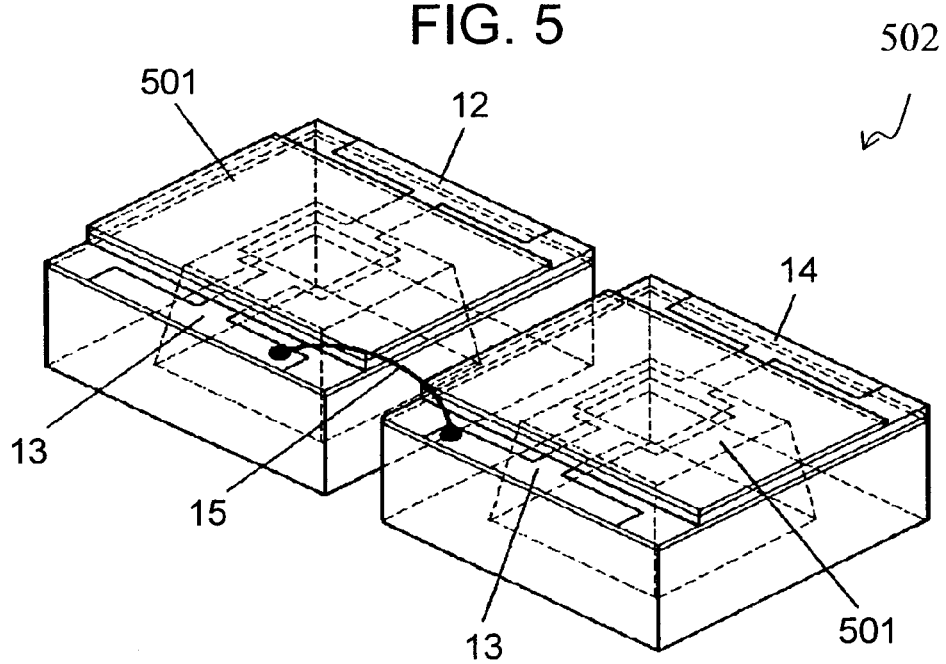
FIG. 5 is a perspective view of the ladder type filter in accordance with an exemplary embodiment of the present invention.

FIG. 5 shows ladder type filter 502 which is formed by a connection shown in the electrical equivalent circuit of FIG. 4. Ladder type filter 502 uses two piezoelectric vibrators 501 which uses aluminum nitride as its piezoelectric material and a fundamental mode of thickness longitudinal vibration as principal vibration. Polarization thereof points in a direction of a thickness of a piezoelectric plate. Ladder type filter 502 is formed of piezoelectric vibrators 501, external terminal 12 for inputting, external terminal 13 for outputting, external terminal 14 for grounding and bonding wire 15. Each of two piezoelectric vibrators 501, which are used in ladder type filters 502, has a laminated structure where dielectric films having substantially the same thickness are disposed at both faces of a piezoelectric plate. Therefore, because the resonance frequency or an electromechanical coupling factor of the piezoelectric vibrator is stable, filter characteristics having a stable band width or the like can be obtained.

Fourth Exemplary Embodiment

A multiple mode filter, which forms a band-pass filter by arranging a plurality of piezoelectric vibrators at one piezoelectric plate and combining vibrations thereof, is used as a filter except a ladder type filter. These filters are also called Monolithic Crystal Filter (MCF) which positively use vibration called inharmonic overtone such as a_0 mode or s_1 mode. A double mode filter using two modes, i.e., s_0 mode and a_0 mode is described hereinafter.

Figure 6:
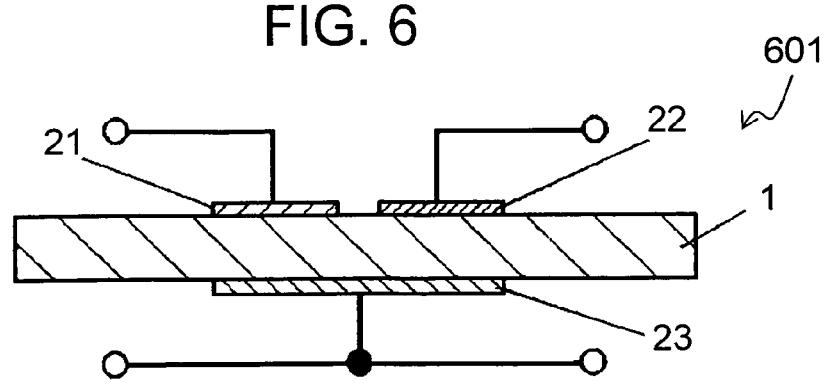
FIG. 6 is a sectional view of a double mode piezoelectric filter.
Figure 7:
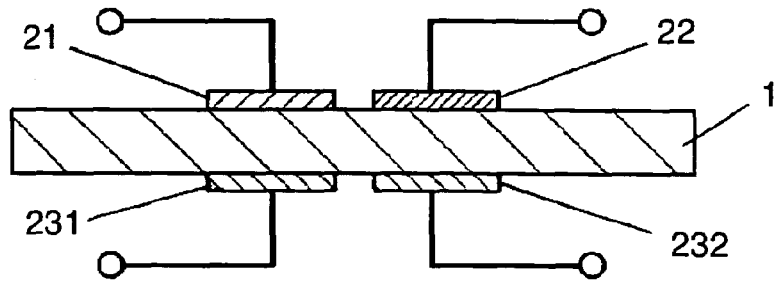
FIG. 7 is a sectional view of a double mode piezoelectric filter.

One example of a structure of double mode filter 601 is shown in FIG. 6. Electrode 21 for inputting and electrode 22 for outputting are formed at a small interval on one face of piezoelectric plate 1, and electrode 23 for grounding is formed on the other face thereof. Using the structure mentioned above, the band-pass filter is provided by generating s_0 mode of a symmetric mode and a_0 mode of an asymmetric mode. FIG. 6 shows an example that only one electrode 23 for grounding is formed. However, as shown in FIG. 7, electrode 231 for grounding corresponding to electrode 21 for inputting and electrode 232 for grounding corresponding to electrode 22 for outputting may be formed.

Figure 8:
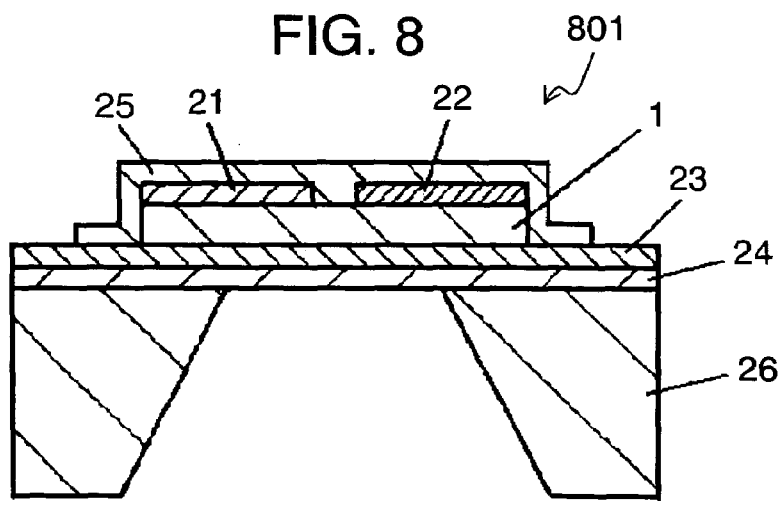
FIG. 8 is a sectional view of a double mode piezoelectric filter in accordance with an exemplary embodiment of the present invention.
Figure 9:
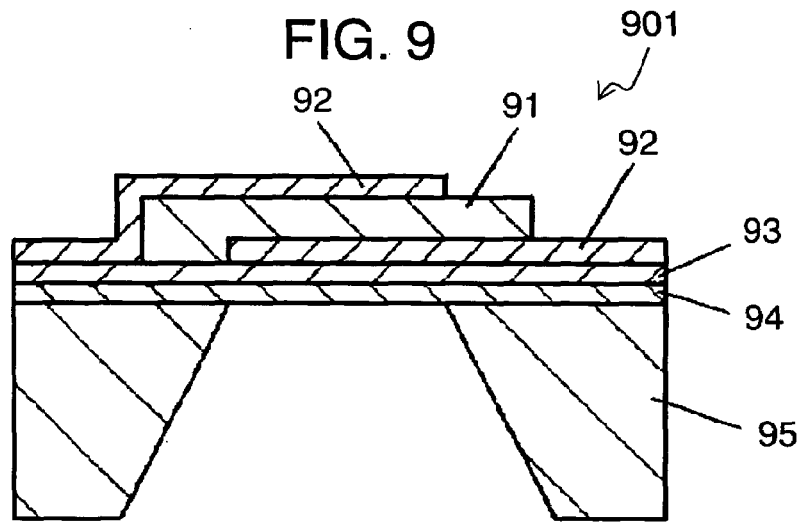
FIG. 9 is a sectional view of a conventional piezoelectric vibrator.

FIG. 8 shows double-mode piezoelectric filter 801, which uses aluminum nitride as its piezoelectric material and a fundamental mode of thickness longitudinal vibration as principal vibration, of the present invention. Piezoelectric filter 801 is formed of piezoelectric plate 1 made of aluminum nitride, electrode 21 for inputting, electrode 22 for outputting, electrode 23 for grounding, silicon nitride film 24 disposed on a back face of piezoelectric plate 1 and silicon oxide film 25 disposed on a front face of piezoelectric plate 1. Supporting substrate 26 made of silicon supports piezoelectric filter 801. Piezoelectric filter 801 has a laminated structure where dielectric films (i.e., silicon nitride film 24 and silicon oxide film 25) having substantially the same thickness and area are disposed at both faces of piezoelectric plate 1. Therefore, because the resonance frequencies of the two vibration modes are stable, filter characteristics having a stable band width or the like can be obtained.

INDUSTRIAL APPLICABILITY

As discussed above, according to the present invention, in a piezoelectric vibrator where polarization of a piezoelectric plate points in a direction of a thickness, exciting electrodes are formed at both faces of the piezoelectric plate. Furthermore, dielectric films are formed at the both faces of the piezoelectric plate. In addition, these dielectric films are substantially symmetric with respect to a point across the piezoelectric plate and geometrically similar, and substantially have the same thickness. The piezoelectric plate employs thickness longitudinal vibration as principal vibration. Using the structure discussed above, a difference of internal stress, which is caused by a difference of stress relaxation in a long term and affects the piezoelectric plate or the dielectric film, becomes small. Therefore, a warp can be considerably small. As a result, a change, which is caused by the warp of the piezoelectric vibrator, in a resonance frequency of the piezoelectric vibrator can be small.

The invention claimed is:

1. A piezoelectric vibrator comprising:
   a piezoelectric plate, having a polarization that points in a direction of a thickness of the piezoelectric plate, the piezoelectric plate having a first face and a second face;
   a first electrode for covering the first face;
   a second electrode for covering the second face;
   a first dielectric film for covering the first electrode; and
   a second dielectric film for covering the second electrode,
   wherein the piezoelectric plate employs a thickness longitudinal vibration as a principal vibration,
   the first dielectric film and the second dielectric film have substantially a same thickness, a substantially same area, and a substantially same geometric shape,
   a ratio of a sum of a thickness (ts) of the first dielectric film and the second dielectric film to the thickness (tp) of the piezoelectric plate is provided in a range such that an electromechanical coupling factor is substantially constant,
   wherein the range of the ratio (ts/tp) is between 0.7 and 2.0, inclusively.

2. The piezoelectric vibrator of claim 1,
   wherein the piezoelectric plate is made of aluminum nitride.

3. The piezoelectric vibrator of claim 1,
   wherein at least one of the first dielectric film and the second dielectric film is made of silicon oxide.

4. The piezoelectric vibrator of claim 1,
   wherein at least one of the first dielectric film and the second dielectric film is made of silicon nitride.

5. The piezoelectric vibrator of claim 1,
   wherein at least one of the first dielectric film and the second dielectric film is formed of a laminated layer of silicon oxide and silicon nitride.

6. The piezoelectric vibrator of claim 1,
   wherein the principal vibration is a fundamental mode of the thickness longitudinal vibration.

7. The piezoelectric vibrator of claim 1,
wherein the principal vibration of the piezoelectric plate is a second overtone mode of the thickness longitudinal vibration.

8. A piezoelectric filter comprising:
a piezoelectric vibrator including:
a piezoelectric plate, having a polarization that points in a direction of a thickness of the piezoelectric plate, the piezoelectric plate having a first face and a second face;
a first electrode for covering the first face;
a second electrode for covering the second face;
a first dielectric film for covering the first electrode; and
a second dielectric film for covering the second electrode,
wherein the piezoelectric plate employs a thickness longitudinal vibration as a principal vibration,
the first dielectric film and the second dielectric film have substantially a same thickness, a substantially same area, and a substantially same geometric shape, a ratio of a sum of a thickness (ts) of the first dielectric film and the second dielectric film to the thickness (tp) of the piezoelectric plate is provided in a range such that an electromechanical coupling factor is substantially constant,
wherein the range of the ratio (ts/tp) is between 0.7 and 2.0, inclusive.

9. The piezoelectric filter of claim 8,
wherein the piezoelectric vibrator includes at least two piezoelectric vibrators, and
the piezoelectric filter is a ladder type filter formed by combining the at least two piezoelectric vibrators.

10. The piezoelectric filter of claim 8,
wherein the piezoelectric vibrator includes a plurality of piezoelectric vibrators, and
the piezoelectric filter is a double mode filter where the plurality of piezoelectric vibrators are formed at the piezoelectric plate.

11. The piezoelectric filter of claim 10,
wherein the first electrode is divided into an electrode for inputting and an electrode for outputting, and the second electrode is used as an electrode for grounding.

12. A method of adjusting a piezoelectric vibrator, the piezoelectric vibrator comprising:
a piezoelectric plate, having a polarization that points in a direction of a thickness of the piezoelectric plate, the piezoelectric plate having a first face and a second face;
a first electrode for covering the first face;
a second electrode for covering the second face;
a first dielectric film for covering the first electrode; and
a second dielectric film for covering the second electrode;
the method comprising:
providing a ratio of a sum of a thickness (ts) of the first dielectric film and the second dielectric film to the thickness (tp) of the piezoelectric plate in a range such that an electromechanical coupling factor is substantially constant; and
adjusting a resonance frequency of the piezoelectric vibrator by changing at least one of the first dielectric film and the second dielectric film,
wherein the piezoelectric plate employs a thickness longitudinal vibration as a principal vibration,
the first dielectric film and the second dielectric film have substantially a same thickness, a substantially same area, and a substantially same geometric shape,
wherein the range of the ratio (ts/tp) is between 0.7 and 2.0, inclusive.

* * * * *

UNITED STATES PATENT AND TRADEMARK OFFICE
CERTIFICATE OF CORRECTION

PATENT NO. : 7,414,349 B2
APPLICATION NO. : 10/500393
DATED : August 19, 2008
INVENTOR(S) : Yukinori Sasaki It is certified that error appears in the above-identified patent and that said Letters Patent is hereby corrected as shown below:

On the Cover Page item [56], References Cited, FOREIGN DOCUMENTS, delete reference JP 62-081807 A 10/1985.

At Column 6, line 51, "inclusively" should read -- inclusive --.

Signed and Sealed this

Eleventh Day of November, 2008

JON W. DUDAS
*Director of the United States Patent and Trademark Office*